(12) United States Patent
Nguyen

(10) Patent No.: US 6,440,219 B1
(45) Date of Patent: Aug. 27, 2002

(54) REPLACEABLE SHIELDING APPARATUS

(75) Inventor: Tue Nguyen, Fremont, CA (US)

(73) Assignee: Simplus Systems Corporation, Fremont, CA (US)

( * ) Notice: Subject to any disclaimer, the term of this patent is extended or adjusted under 35 U.S.C. 154(b) by 109 days.

(21) Appl. No.: 09/589,635

(22) Filed: Jun. 7, 2000

(51) Int. Cl.[7] ............................................. C23C 16/04
(52) U.S. Cl. ...................... 118/721; 118/503; 118/504; 118/505
(58) Field of Search ................................ 118/720, 721, 118/503, 504, 505; 427/282

(56) References Cited

U.S. PATENT DOCUMENTS

| | | | |
|---|---|---|---|
| 4,932,358 A | | 6/1990 | Studley et al. |
| 5,304,248 A | | 4/1994 | Cheng et al. |
| 5,711,815 A | * | 1/1998 | Lee et al. ..................... 118/725 |
| 5,740,009 A | * | 4/1998 | Pu et al. ....................... 361/234 |
| 5,766,363 A | * | 6/1998 | Mizuno et al. .............. 118/725 |
| 5,851,299 A | * | 12/1998 | Cheng et al. ................ 118/729 |
| 5,997,651 A | * | 12/1999 | Matsusi et al. .............. 118/725 |

* cited by examiner

Primary Examiner—Laura Edwards

(57) ABSTRACT

A replaceable shielding apparatus provides a cost effective way of shielding a portion of a workpiece during processing. The apparatus includes a replaceable shield, made of comparable weight as the workpiece for allowing replacement of the shield in the same way as the replacement of the workpiece. With this feature, the replacement of the shield is a routine process and would not interfere much with the workpiece operation. The invention further includes a shield clamp for clamping the shield onto the workpiece. In a preferred embodiment, the invention further includes a nonreactive gas inlet for creating a pressurized cavity in the vicinity of the shielded portion of the workpiece.

2 Claims, 6 Drawing Sheets

REPLACEABLE SHIELDING APPARATUS

FIELD OF THE INVENTION

The present invention relates generally to apparatus for processing of a semiconductor wafer, and more particularly to an edge exclusion apparatus employing a replaceable shield with comparable weight as the semiconductor wafer for allowing the replacement of the shield in the same way as the replacement of the semiconductor wafer.

BACKGROUND OF THE INVENTION

During the deposition of materials on a semiconductor wafer, it is desirable to exclude the materials from depositing on the edge of the front surface, the end edges and the backside of the wafer. This is important when the wafer requires surface treatment to improve the adhesion of the deposited material as in the case of tungsten deposition. The wafer surface needs to be coated with a adhesion promoter material such as titanium tungsten (TiW), or titanium nitride (TiN) before the deposition of tungsten to ensure proper adhesion. When tungsten is deposited on the front edge, end edges or backside of the wafer where there is no TiW or TiN, the deposited tungsten does not adhere properly and flakes off as particles. The generation of particles such as these could be damaging to subsequent wafer processing. Edge and backside exclusion is also of particular importance when the deposited materials requires a diffusion barrier layer to prevent the deposited materials from reaching the silicon wafer, creating device degradation. For example, copper is deposited on a diffusion barrier layer such as TiN, tantalum nitride, tungsten nitride. Without the diffusion barrier layer, copper could migrate to the silicon area and degrade the device performance. Deposition of copper on the backside, end edges and front edge where there is no diffusion barrier material severely affects the device properties.

FIG. 1 shows a prior art edge exclusion apparatus employing purging gas to prevent edge and backside deposition. Deposition precursor enters the inlet 20, and deposits on the wafer 10. The inlet 20 could be a showerhead, providing precursor flow 16 to the wafer 10 at a more uniform distribution. Purging gas 15 enters the gap between the wafer holder 30 and the blocker 24 to prevent material deposition at the wafer 10 edge and backside. Precursor flow 16 continues to 26 and purging gas 15 continues to 25 to reach the exhaust. The major drawback of this prior art apparatus is the high purging gas required to prevent edge and backside deposition, typically in the range of liter per minute flow. Therefore this apparatus is not suitable for system using low precursor flow.

Another prior art apparatus is U.S. Pat. No. 4,932,358 of Studley et al. Studley et al. disclosed a seal ring which presses down against a wafer on a CVD chuck continuously around the outer periphery of the wafer, and with sufficient force to hold the backside of the wafer against the chuck. This apparatus requires a complicated mounting mechanism to move the seal ring in and out of clamping engagement with the wafer and to maintain alignment between the seal ring and the wafer. Furthermore, the seal ring can only be as wide as the diameter of the chuck.

FIG. 2 shows a prior art apparatus from U.S. Pat. No. 5,851,299 of Cheng et al. Cheng et al. disclosed a shield ring 50 normally rests on a ring support 72. The shield ring 50 engages the front side edge of the wafer 10 when the wafer support 40 is raised into the contact position by the susceptor lift 46. The wafer edge and backside is shielded from the precursor flow from the showerhead 20. Cheng et al. also disclosed an additional purging gas flow 1 retained in the cavity between the wafer support 40, the wafer 10 and the shield ring 50. The purging gas 1 also exhausts through the gap 2 between the ring support 72 and the shield ring 50, and combines with the precursor exhaust 3 to reach the vacuum pump.

As with the other prior art, the major drawback of this shield ring is that eventually there will be some deposition at the edge of the shield ring at the locations where the shield ring contacts the wafer. This gap between the shield to ring and the wafer caused by material deposit will be widen quickly with time due to more and more material deposition. This process causes the shield ring to lose contact with the wafer and thus no longer perform the shielding action. The apparatus will need to shut down, the chamber vented, and the shield ring manually replaced. Then the chamber will be pump down and the system needs conditioning for process qualification before running again. This causes a significant lost in productivity.

The purging gas is helpful in reducing the built up of material deposit at the shield ring edge. However in prior art Cheng et al. apparatus, as seen in FIG. 2, the purging gas escapes easily through the big gap between the shield ring 50 and the ring support 72. In Cheng et al. apparatus, this gap is required for proper shielding of the wafer. The minimum gap size is probably 0.1" to allow adequate separation between the shield ring and the wafer for the removal of the wafer. Assuming a 10" diameter for the shield ring for the processing of a 8" wafer, the purging gas area is 0.1×10, translated into an equivalent diameter D of 1.1". The 1.1" diameter opening would requires a very high flow rate to retain the purging gas at the connection of the wafer and the shield ring to prevent material deposition there, especially when the typical inlet of the purging gas is only 0.25" in diameter.

It would be advantageous to develop a shielding apparatus that reduces the down time of the system.

It would be advantageous to develop an apparatus with smaller purging gas escape flow.

SUMMARY OF THE INVENTION

Accordingly, a replaceable shielding apparatus is provided. The apparatus includes a replaceable shield of comparable weight as the wafer, thus allowing the replacement of the shield in the same way as the replacement of the wafer. With this replaceable shielding apparatus, the system no longer needs to be shut down for shield replacement. The shield replacement can be performed at every wafer, or at every 25 wafers, or one a day, or one a week, depend on the degradation of the shield ring due to material deposited at the shield ring edge.

The apparatus for replaceably shielding a portion of a workpiece in a processing system comprises:

a) a workpiece support for supporting the workpiece within the system;

b) a replaceable shield of comparable weight as the workpiece for allowing replacement of the shield in the same way as the replacement of the workpiece, the shield engaging a portion of the workpiece and shielding the engaged portion of the workpiece during processing thereof to prevent processing on the engaged portion of the workpiece;

c) a moving means for engaging the shield with the portion of the workpiece.

The apparatus includes a workpiece support to support the workpiece, a replaceable shield ring of comparable weight as the workpiece to permit the use of workpiece replacement mechanism for replacing the shield ring, and a moving means for engaging the shield with the workpiece. The workpiece replacement mechanism allows the workpiece to be replaced without the need to shut down the system, thus by using the workpiece replacement mechanism to replace the shield ring, the system will not need to be shut down for shield ring replacement service. The moving means could be permanently connected to the workpiece support for moving the workpiece support to engage the shield with the workpiece. The moving means could be connected to the shield for moving the shield to engage the shield with the workpiece. In this case, when the shield is engaged with the workpiece, the moving means could be disconnected from the shield.

The present invention further provides a shield restraint clamp for holding the shield against the portion of the workpiece. In the applications that the workpiece is lightweight, such as that of a silicon wafer, the shield ring could benefit from a shield restraint clamp for holding the shield against the engaged portion of the workpiece with the shield ring. The shield restraint clamp is holding the shield down by its own weight.

The present invention further provides a shield restraint pressing means for pressing on the shield restraint clamp so that the shield is pressing against the portion of the workpiece. The shield restraint pressing means provides an additional force for holding down the shield against the workpiece. The shield restraint pressing means provides an extra degree of freedom in the designing of the replaceable shield ring apparatus.

In some aspects of the invention, the shield restraint pressing means employs a spring action for pressing on the shield restraint clamp. Other pressing means include electrostatic force, electromagnetic force, compressed air cylinder.

The present invention further provides a shield support means for supporting the shield so that the shield and the workpiece are spaced apart when the moving means disengages the workpiece from the shield. The shield support separates the shield from the workpiece in the disengaged position so that the workpiece can be replaced without disturbing the shield.

The present invention further provides a shield restraint support means for supporting the shield restraint clamp so that the shield and the shield restraint clamp are spaced apart when the moving means disengages the workpiece from the shield. The shield restraint support separates the shield from the shield restraint clamp in the disengaged position so that the shield can be replaced without disturbing the shield restraint clamp.

In some aspects of the invention, the moving means for moving the workpiece support comprises a movable shaft connected to the workpiece support. In some aspects of the invention, the movable shaft consists of a shaft connected to a linear guide for allowing the shaft to travel a straight line. An air cylinder or a motor, such as a stepper motor or a servo motor, could serve to power the movable shaft.

In some aspects of the invention, the workpiece support has a top surface. The top surface of the workpiece support is then circular. The circular workpiece support is for a circular workpiece such as a silicon wafer. With a circular workpiece, the shield has an annular form to shield the outside perimeter of the workpiece.

The present invention further provides a shield alignment means, connected to the shield and the shield support means, for aligning the shield with the shield support means. The present invention further provides a shield restraint alignment means, connected to the shield restraint clamp and the shield restraint support means, for aligning the shield restraint clamp with the shield restraint support means. These alignment means could be in the form of an alignment slot and an alignment pin to allow the shield and the shield restraint clamp to stay at precise positions during the engagement and disengagement of the workpiece support.

In a preferred embodiment for vacuum applications, the apparatus for replaceably shielding a portion of a workpiece in a processing system comprises:
a) a workpiece support for supporting the workpiece within the system;
b) a replaceable shield of comparable weight as the workpiece for allowing replacement of the shield in the same way as the replacement of the workpiece, the shield engaging a portion of the workpiece and shielding the engaged portion of the workpiece during processing thereof to prevent processing on the engaged portion of the workpiece;
c) a moving means for engaging the shield with the portion of the workpiece.
d) a shield restraint clamp for holding the shield against the portion of the workpiece;
e) a non-reactive gas inlet for providing a non-reactive gas to a cavity defined by the workpiece support, the workpiece, the shield and the shield restraint clamp, the cavity retaining the non-reactive gas in the vicinity of the shielded portion of the workpiece.

The additional non-reactive gas inlet supplies a higher pressure in the cavity defined by the workpiece support, the workpiece, the shield and the shield restraint clamp than the pressure in the processing system, thus provides further assurance that the depositing material will not deposit at the edge and backside of the workpiece.

In some aspects of the invention, the shield restraint clamp stays close to the workpiece support so that the cavity retaining the non-reactive gas has no large leak when the moving means engages the workpiece with the shield. To maintain high differential pressure between the cavity and the chamber pressure, the cavity needs to not having large leakage. In some aspects of the invention, the shield restraint clamp rests on the workpiece support when the moving means engages the workpiece with the shield to maintain small leakage inside the cavity.

In some aspects of the invention, the workpiece is a semiconductor wafer, the workpiece support has a top surface, the top surface of the workpiece support is circular, and the cavity retains the non-reactive in the vicinity of the circumferencial edge of the semiconductor wafer.

DETAIL DESCRIPTION OF THE PREFERRED EMBODIMENT

Figure 1:
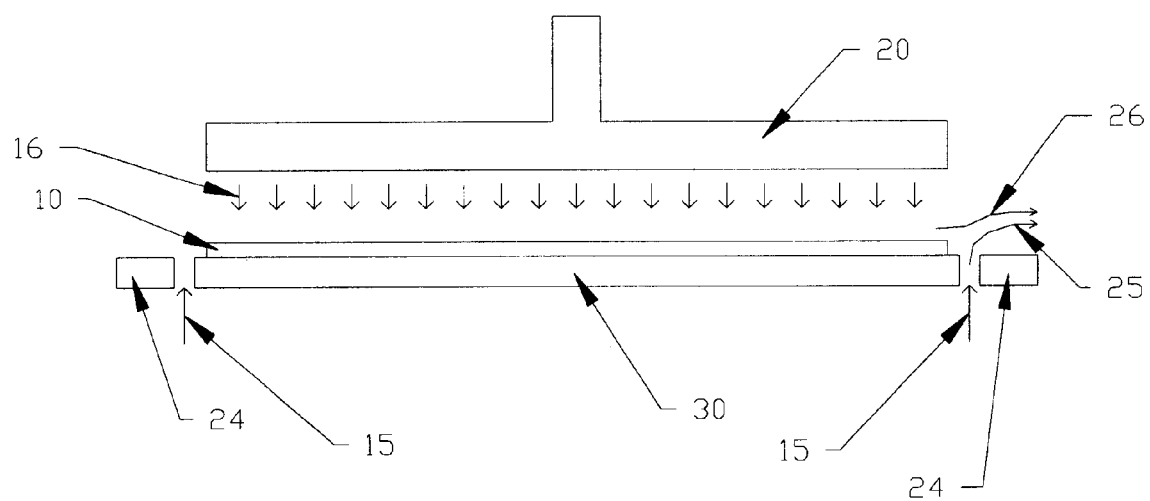
FIG. 1 shows a prior art edge exclusion apparatus.
Figure 2:
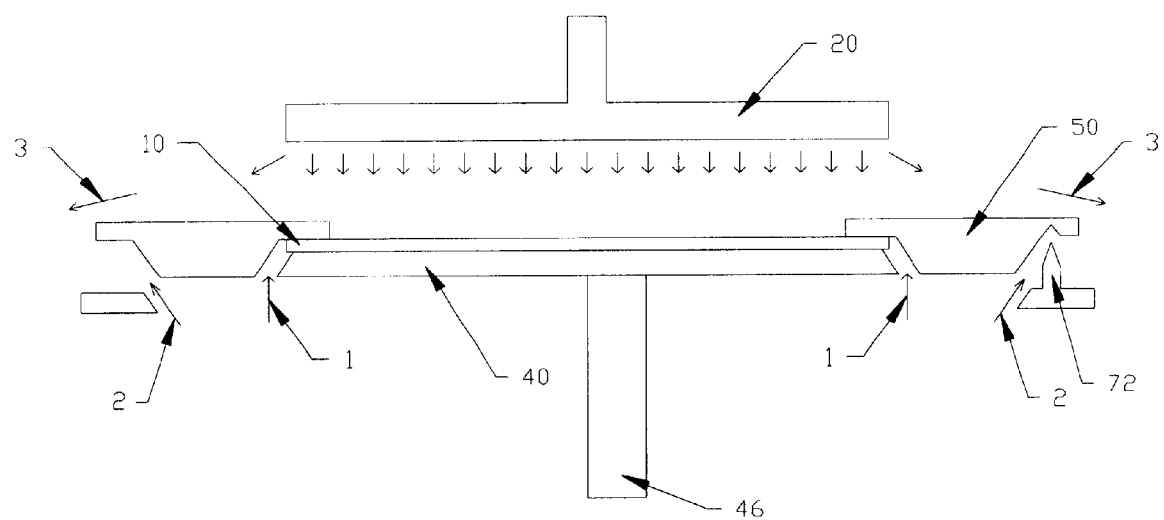
FIG. 2 shows another prior art edge exclusion apparatus.
Figure 3:
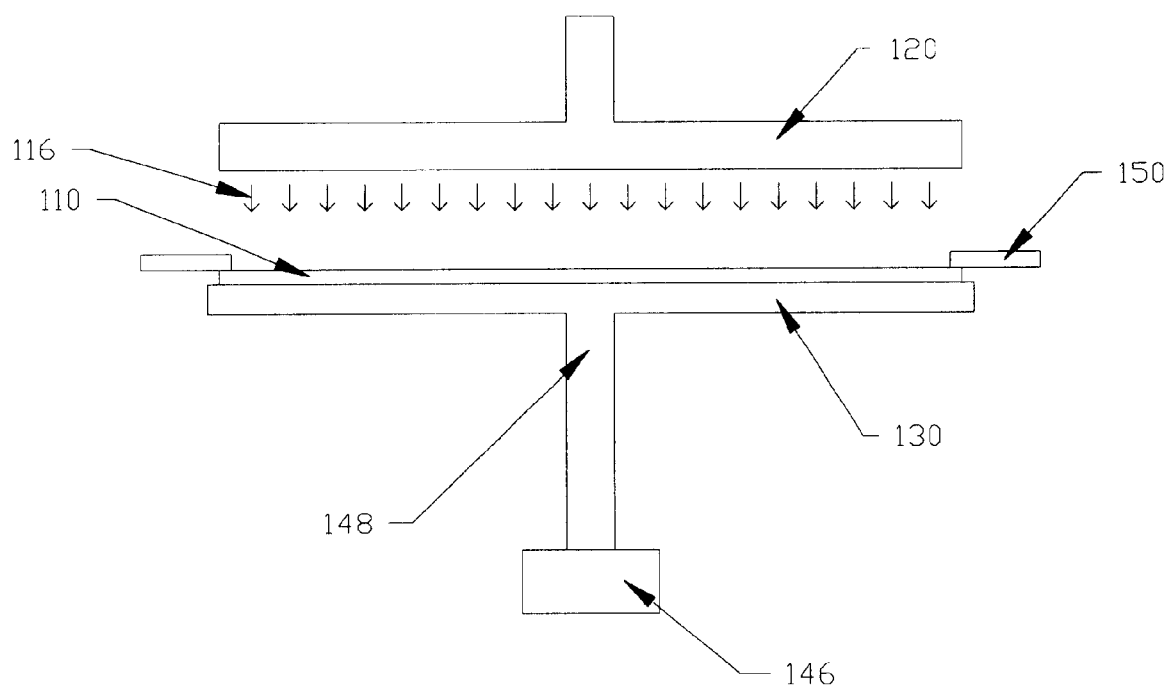
FIG. 3 shows the present invention of the replaceable shielding apparatus in the engaged position.

FIG. 3 shows the present invention of the replaceable shielding apparatus in the engaged position. The workpiece 110 is supported by the workpiece support 130. The workpiece support 130 in FIG. 3 is a disk type, having a top surface for supporting the whole wafer. In some aspects of the invention, the workpiece support is a pin type, supporting the workpiece at a minimum of 3 points (not shown). The workpiece support 130 is connected to a moving means 148. In some aspects of the invention, the moving means 148 is a shaft connected to a susceptor lift 146. The susceptor lift 146 moves the shaft 148, and thus moves the workpiece support 130 between the disengaged and engaged position. The replaceable shield 150 is of comparable weight as the workpiece 110 for allowing the replacement of the shield 150 in the same way as the replacement of the workpiece 110. The shield 150 in the engaged position shields a portion of the workpiece 110 to prevent deposition at the workpiece edge and backside from the showerhead 120 having precursor flow 116.

Figure 4:
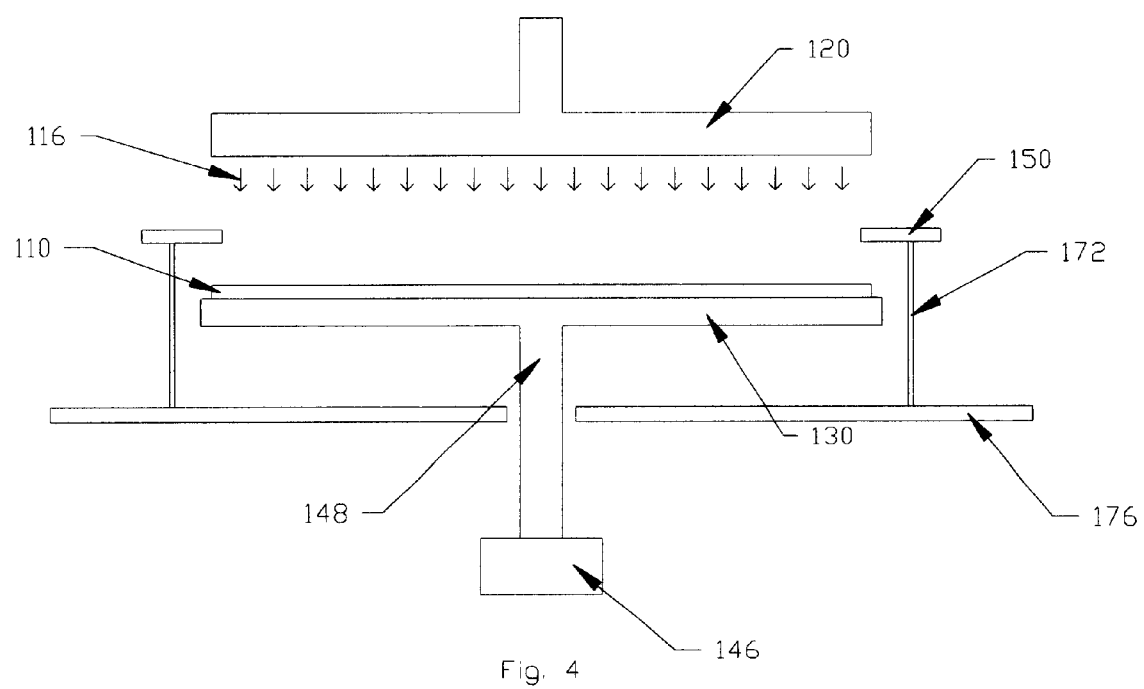
FIG. 4 shows the present invention of the replaceable shielding apparatus in the disengaged position.

FIG. 4 shows the present invention of the replaceable shielding apparatus in the disengaged position. The susceptor lift 146 moves the shaft 148 and the workpiece support 130, leaving the replaceable shield 150 in the disengaged position. The shield support 172 separates the shield 150 from the workpiece 110 to allow the removal of the shield 150. The shield support 172 is connected to a stationary wall 176 such as the chamber wall.

Figure 5:
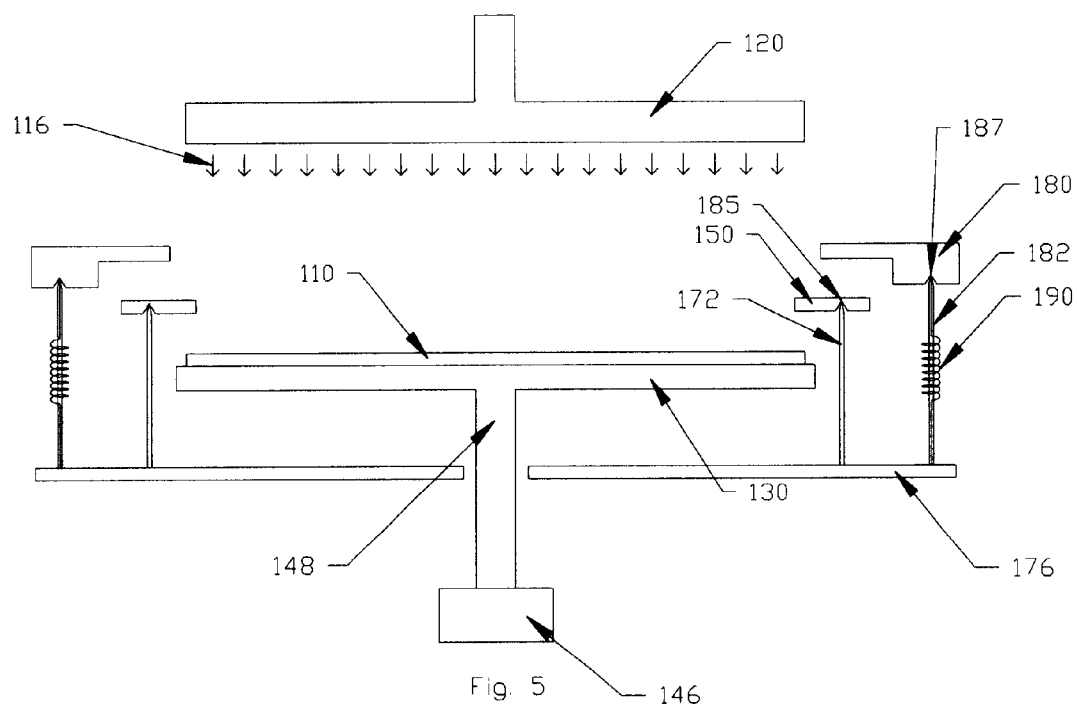
FIG. 5 shows the present invention of the replaceable shielding apparatus in the disengaged position with the shield restraint clamp means.

FIG. 5 shows the present invention of the replaceable shielding apparatus in the disengaged position with the shield restraint clamp means. The shield restraint clamp 180 is supported by the shield restraint clamp support 182 in the disengaged position to separate the shield restraint clamp 180 from the shield 150 to allow the removal of the shield 150. The shield restraint pressing means 190, in this case an extended spring, connects the shield restraint clamp 180 to the wall 176 for pressing the shield 150 against the workpiece 110 in the engaged position. The pin 187 allows the alignment of the shield restraint clamp 180 between the engaged and disengaged positions. Similarly, the pin 185 allows the alignment of the shield 150 between the engaged and disengaged positions. The shield support 172 is connected to the stationary wall 176. In some aspects of the invention, the shield support 172 is connected to the shield restraint clamp means 180 (not shown).

Figure 6:
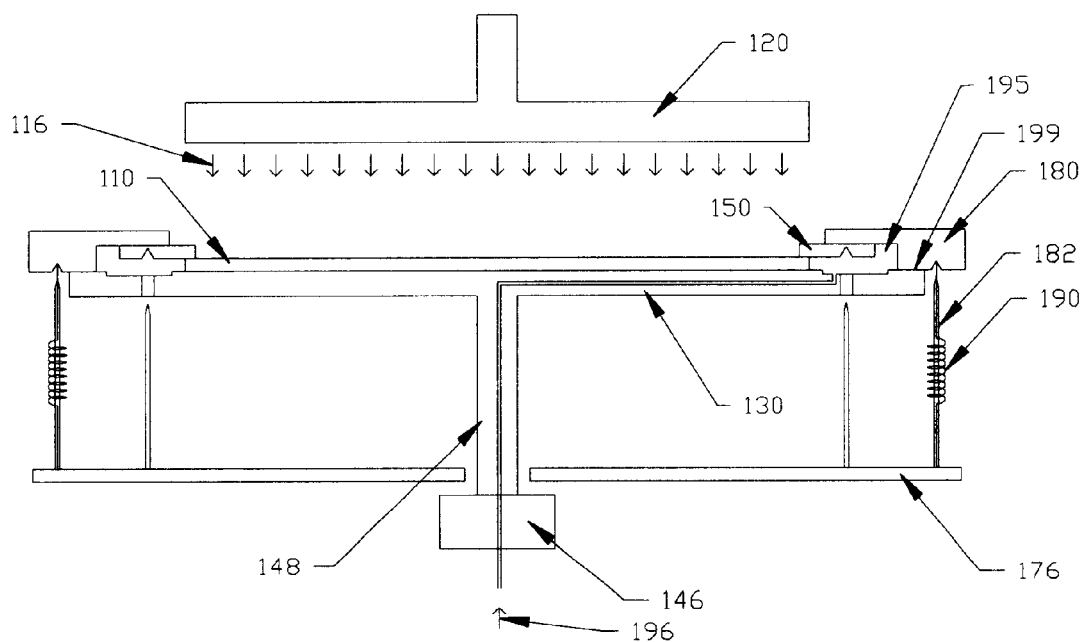
FIG. 6 shows the present invention of the replaceable shielding apparatus in the engaged position with the purging gas.

FIG. 6 shows the present invention of the replaceable shielding apparatus in the engaged position with the purging gas. The purging gas 196 enters from outside the system to the cavity 195 defined by the workpiece support 130, the workpiece 110, the shield 150 and the shield restraint clamp 180. The shield restraint clamp 180 is resting on the workpiece support 130 at location 199, therefore the purging gas leakage should be minimum. The opening in the workpiece support 130 for the entrance of the shield support 172 might provide a high leakage path for the purging gas, but this opening is still small, about ¼" in diameter. An alternative to eliminate this leakage path is to connect the shield support to the shield restraint clamp 180 (not shown). The cavity 195 retains the purging gas, creates a higher pressure in the cavity 195 than in the chamber, therefore further preventing the deposition at the shielding portion of the workpiece.

What is claimed is:

1. An apparatus for replaceably shielding a portion of a workpiece in a processing system comprising:
   a) workpiece support for supporting the workpiece within the system;
   b) a replaceable shield of comparable weight as the workpiece for allowing replacement of the shield in the same way as the replacement of the workpiece, the shield engaging a portion of the workpiece and shielding the engaged portion of the workpiece during processing thereof to prevent processing on the engaged portion of the workpiece;
   c) a moving means for engaging the shield with the portion of the workpiece;
   d) a shield restraint clamp for holding the shield against the portion of the workpiece and a shield restraint alignment means, connected to the shield restraint clamp and the shield restraint support means, for aligning the shield restraint clamp with the shield restraint support means.

2. An apparatus for replaceably shielding a portion of a workpiece in a processing system comprising:
   a) a workpiece support for supporting the workpiece within the system;
   b) a replaceable shield of comparable weight as the workpiece for allowing replacement of the shield in the same way as the replacement of the workpiece, the shield engaging a portion of the workpiece and shielding the engaged portion of the workpiece during processing thereof to prevent processing on the engaged portion of the workpiece;
   c) a moving means for engaging the shield with the portion of the workpiece;
   d) a shield restraint clamp for holding the shield against the portion of the workpiece;
   e) a non-reactive gas inlet for providing a non-reactive gas to a cavity defined by the workpiece support, the workpiece, the shield and the shield restraint clamp, the cavity retaining the non-reactive gas in the vicinity of the shielded portion of the workpiece; and
   f) a shield restraint alignment means, connected to the shield restraint clamp and the shield restraint support means, for aligning the shield restraint clamp with the shield restraint support means.

* * * * *